(12) United States Patent
Kim et al.

(10) Patent No.: US 8,948,224 B2
(45) Date of Patent: Feb. 3, 2015

(54) SEMICONDUCTOR LASER DEVICE AND METHOD OF FABRICATING THE SAME

(75) Inventors: In Gyoo Kim, Daejeon (KR); Gyungock Kim, Daejeon (KR); Sang Hoon Kim, Daejeon (KR); JiHo Joo, Goyang (KR); Ki Seok Jang, Daejeon (KR)

(73) Assignee: Electronics and Telecommunications Research Institute, Daejeon (KR)

(*) Notice: Subject to any disclaimer, the term of this patent is extended or adjusted under 35 U.S.C. 154(b) by 199 days.

(21) Appl. No.: 13/545,889

(22) Filed: Jul. 10, 2012

(65) Prior Publication Data
US 2013/0156057 A1    Jun. 20, 2013

(30) Foreign Application Priority Data
Dec. 16, 2011    (KR) .......................... 10-2011-0136674

(51) Int. Cl.
*H01L 21/00*    (2006.01)

(52) U.S. Cl.
USPC ............... 372/44.01; 438/22; 438/46; 438/47

(58) Field of Classification Search
CPC . H01L 51/5064; H01L 27/3276; H01L 21/00; H01L 33/58; H01L 21/02603; H01L 29/0669
USPC ........... 257/21, 51, 461, 83, 432, E49.001–4, 257/E21.404; 438/69, 689, 425, 31, 514, 2; 372/43.01, 44.01
See application file for complete search history.

(56) References Cited

U.S. PATENT DOCUMENTS

| | | | |
|---|---|---|---|
| 7,596,158 B2 | 9/2009 | Liu et al. | |
| 7,627,018 B1* | 12/2009 | Guilfoyle et al. | 372/102 |
| 2004/0165637 A1* | 8/2004 | Bullington et al. | 372/50 |
| 2004/0196557 A1* | 10/2004 | Takeda | 359/579 |
| 2005/0141808 A1* | 6/2005 | Cheben et al. | 385/31 |
| 2007/0296204 A1* | 12/2007 | Phillips et al. | 283/72 |
| 2009/0297093 A1* | 12/2009 | Webster et al. | 385/14 |
| 2010/0078680 A1* | 4/2010 | Cheng et al. | 257/184 |
| 2011/0142089 A1* | 6/2011 | Kudo | 372/46.012 |
| 2011/0198711 A1* | 8/2011 | Padron et al. | 257/415 |
| 2011/0243496 A1* | 10/2011 | Jones | 385/14 |
| 2011/0299166 A1* | 12/2011 | Sun | 359/579 |
| 2012/0107738 A1* | 5/2012 | Argoitia et al. | 430/110.3 |
| 2012/0287959 A1* | 11/2012 | Tani et al. | 372/45.01 |

OTHER PUBLICATIONS

Nathalie Vermeulen et al., "Applications of coherent anti-Stokes Raman scattering in silicon photonics", Proc. of SPIE, 2010, pp. 760611-1-760611-13, vol. 7606, SPIE.

Alexander W. Fang et al., "A distributed feedback silicon evanescent laser", Optics Express, Mar. 31, 2008, pp. 4413-4419, vol. 16, No. 7, Optical Society of America.

(Continued)

*Primary Examiner* — Yuanda Zhang
*Assistant Examiner* — Sheikh Maruf

(57) ABSTRACT

The inventive concept provides semiconductor laser devices and methods of fabricating the same. According to the method, a silicon-crystalline germanium layer for emitting a laser may be formed in a selected region by a selective epitaxial growth (SEG) method. Thus, surface roughness of both ends of a Fabry Perot cavity formed of the silicon-crystalline germanium layer may be reduced or minimized, and a cutting process and a polishing process may be omitted in the method of fabricating the semiconductor laser device.

13 Claims, 4 Drawing Sheets

(56) References Cited

OTHER PUBLICATIONS

Jifeng Liu et al., "Tensile-strained, n-type Ge as a gain medium for monolithic laser integration on Si", Optics Express, Sep. 3, 2007, pp. 11272-11277, vol. 15, No. 18, Optical Society of America.

Jifeng Liu et al., "Ge-on-Si laser operating at room temperature", Optics Letters, Mar. 1, 2010, pp. 679-681, vol. 35, No. 5, Optical Society of America.

Jifeng Liu et al., "Band-Engineered Ge-on-Si Lasers", IEDM10, 2010, pp. 146-149, IEEE.

* cited by examiner

SEMICONDUCTOR LASER DEVICE AND METHOD OF FABRICATING THE SAME

CROSS-REFERENCE TO RELATED APPLICATIONS

This U.S. non-provisional patent application claims priority under 35 U.S.C. §119 to Korean Patent Application No. 10-2011-0136674, filed on Dec. 16, 2011, the entirety of which is incorporated by reference herein.

BACKGROUND

The inventive concept relates to semiconductor laser devices and, more particularly, to semiconductor laser devices facilitating monolithic integration and methods of fabricating the same.

Development of complementary metal oxide semiconductor (CMOS) devices has been faced with limitations of data transfer speed and power consumption. Thus, various researches have been conducted for a technique realizing optical interconnection on a silicon wafer.

Optical transmitters, optical receivers, and optical passive devices have been applied to the optical interconnection technique on the silicon wafer through various researches. However, it may be required to develop a light source facilitating monolithic integration on a silicon substrate and not needing an external light-pumping. For satisfying the above requirement, researches have been conducted for a laser device fabricated by growing germanium on the silicon substrate.

If a germanium semiconductor laser device is fabricated on the silicon substrate, it may be difficult, due to property of silicon, to cleave the silicon substrate along a cleavage plane thereof for forming facets of both ends of a gain medium (i.e., a germanium layer). Thus, after sawing the silicon substrate, a facet polishing process may be performed. In this case, it may be difficult to monolithically integrate the laser device with and optical devices such as an optical modulator, a photo detector, and a wavelength multiplexer.

SUMMARY

Embodiments of the inventive concept may provide semiconductor laser devices capable of omitting a cutting process and a facet polishing process of both ends of a Fabry Perot cavity during manufacture of the semiconductor laser devices, and methods of fabricating the same.

Embodiments of the inventive concept may provide semiconductor laser devices capable of easily facilitating monolithic integration and methods of fabricating the same.

In one aspect, a method of fabricating a semiconductor laser device may include: forming a mask layer on a substrate; patterning the mask layer to form a mask pattern having an opening exposing the substrate; forming a single-crystalline germanium layer used as a Fabry Perot cavity in the opening by a selective epitaxial growth (SEG) method; and forming an electrode on the single-crystalline germanium layer. Patterning the mask layer may include: after etching the mask layer by one of a dry etching process and a wet etching process, etching the mask layer by the other of the dry etching process and the wet etching layer for improving a surface roughness of sidewalls of the mask pattern.

In some embodiments, the mask layer may be formed of silicon oxide.

In other embodiments, the wet etching process may use hydrofluoric acid.

In still other embodiments, the substrate may be a silicon substrate or a silicon-on-insulator (SOI) substrate.

In yet other embodiments, the method may include: forming a spacer adjacent to a first end of the Fabry Perot cavity.

In yet still other embodiments, the spacer may include metal or silicon oxide.

In yet still other embodiments, the spacer may include a grating mirror.

In yet still other embodiments, the grating mirror may have a photonic band gap structure.

In yet still other embodiments, the spacer and the Fabry Perot cavity may be spaced apart from each other by the mask layer.

In yet still other embodiments, the method may further include: forming an optical coupler adjacent to a second end of the Fabry Perot cavity.

In yet still other embodiments, the optical coupler may include an optical waveguide.

In yet still other embodiments, the optical waveguide may include single-crystalline silicon or silicon nitride.

In yet still other embodiments, the mask layer may fill between the first end of the Fabry Perot cavity and the spacer and between the second end of the Fabry Perot cavity and the optical coupler.

In yet still other embodiments, a top surface of the Fabry Perot cavity may be disposed at a height different from top surfaces of the spacer and the optical coupler.

In another aspect, a semiconductor laser device may include: a substrate; a Fabry Perot cavity of single-crystalline germanium grown by a selective epitaxial growth (SEG) method on the substrate; a spacer adjacent to a first end of the Fabry Perot cavity and be spaced apart from the Fabry Perot cavity; and an optical coupler adjacent to a second end of the Fabry Perot cavity and be spaced apart from the Fabry Perot cavity. A top surface of the Fabry Perot cavity may be disposed at a height different from a top surface of the spacer and/or a top surface of the optical coupler.

In some embodiments, the spacer may include metal or silicon oxide.

In other embodiments, the Fabry Perot cavity may have a first facet adjacent to the spacer; and wherein the spacer may include a trench exposing the first facet.

In still other embodiments, the optical coupler may include an optical waveguide.

In yet other embodiments, the optical waveguide may include single-crystalline silicon or silicon nitride.

In yet still other embodiments, a space between the first end of the Fabry Perot cavity and the spacer and a space between the second end of the Fabry Perot cavity and the optical coupler may be filled with silicon oxide.

BRIEF DESCRIPTION OF THE DRAWINGS

The inventive concept will become more apparent in view of the attached drawings and accompanying detailed description.

DETAILED DESCRIPTION OF THE EMBODIMENTS

Figure 1:
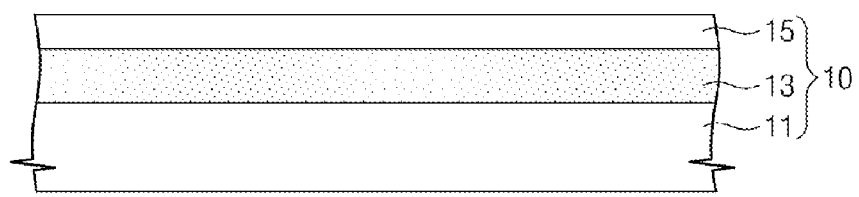
FIGS. 1 to 5 are cross-sectional views illustrating a method of fabricating a semiconductor laser device according to embodiments of the inventive concept.

The inventive concept will now be described more fully hereinafter with reference to the accompanying drawings, in which exemplary embodiments of the inventive concept are shown. The advantages and features of the inventive concept and methods of achieving them will be apparent from the following exemplary embodiments that will be described in more detail with reference to the accompanying drawings. It should be noted, however, that the inventive concept is not limited to the following exemplary embodiments, and may be implemented in various forms. Accordingly, the exemplary embodiments are provided only to disclose the inventive concept and let those skilled in the art know the category of the inventive concept. In the drawings, embodiments of the inventive concept are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal exemplary views of the inventive concept. Accordingly, shapes of the exemplary views may be modified according to manufacturing techniques and/or allowable errors. Therefore, the embodiments of the inventive concept are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concept.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concept explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

FIGS. 1 to 5 are cross-sectional views illustrating a method of fabricating a semiconductor laser device according to embodiments of the inventive concept;

Referring to FIG. 1, a semiconductor substrate 10 is prepared. The semiconductor substrate 10 may be a silicon-on-insulator (SOI) substrate. The semiconductor substrate 10 may include a silicon substrate 11, a buried oxide layer 13, and an upper silicon layer 15. The upper silicon layer 15 may include an epitaxial layer doped with dopants in situ for formation of an electrode supplying a current. Alternatively, the upper silicon layer 15 may be doped with dopants by an ion implantation method. Light may be guided and transmitted along a waveguide formed in the upper silicon layer 15 by difference between refractive indexes of the upper silicon layer 15 and the buried oxide layer 13. Thus, optical devices of a silicon optical waveguide, a modulator, a photo detector, and a ring-filter may be monolithically formed. A silicon photonics technique forming optical devices on the semiconductor substrate 10 may form optical devices of high performance, low cost, and a large area by using the silicon substrate 10. The silicon photonics technique may be able to monolithically integrate electric integrated circuits of a driver and an amplifying circuit with the optical device.

In the drawings, the semiconductor substrate 10 is the SOI substrate. However, the inventive concept is not limited thereto. The semiconductor substrate 10 may be a bulk silicon substrate. In this case, a local SOI region may be formed in the bulk silicon substrate by a partial thermal oxidation method such as a LOCOS (local oxidation of silicon) process. The optical device may be fabricated on the local SOI region, such that the optical device may be integrated with the semiconductor laser device according to embodiments of the inventive concept.

Figure 2:
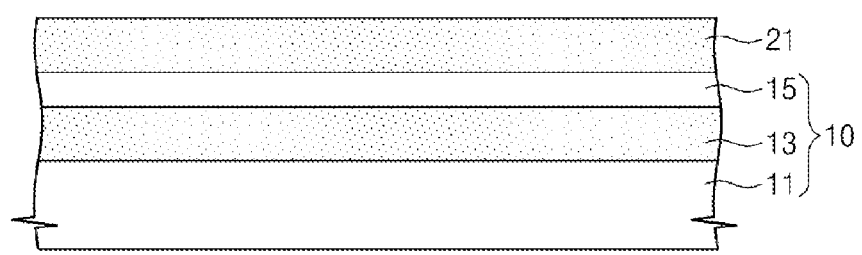

Referring to FIG. 2, a mask layer 21 may be formed on the semiconductor substrate 10 by, for example, a low pressure chemical vapor deposition (LPCVD) method. For example, the mask layer 21 may be a silicon oxide layer.

Figure 3:
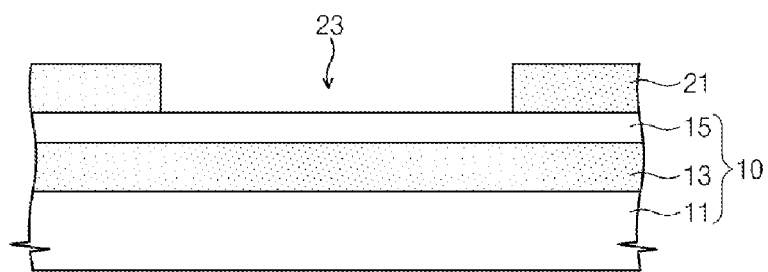

Referring to FIG. 3, the mask layer 21 may be patterned to form an opening 23 exposing the upper silicon layer 15.

The process patterning the mask layer 21 will be described in more detail. A photoresist pattern (not shown) may be formed on the mask layer 21 and then the mask layer 21 may be etched using the photoresist pattern as an etch mask. The etching process may include a dry etching process and a wet etching process. For example, after the mask layer 21 may be etched by the dry etching process, the mask layer 21 may be etched by the wet etching process. Alternatively, after the mask layer 21 may be etched by the wet etching process, the mask layer 21 may be etched by the dry etching process. Thus, the mask layer 21 may be patterned by combination of the dry etching process and the wet etching process. The dry etching process may be a reactive ion etching (RIE) process or an inductively coupled plasma (ICP) process. The wet etching process may be performed using a strongly acidic etchant (e.g., hydrofluoric acid) etching the mask layer 21. The combination of the dry etching process and the wet etching process may reduced or minimize surface roughness of sidewalls of the patterned mask layer 21. Additionally, etched surfaces may be maximally vertically formed by the combination of the dry etching process and the wet etching process.

Figure 4:
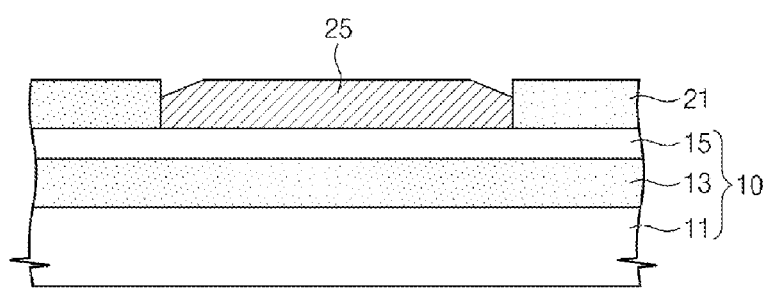

Referring to FIG. 4, a single-crystalline germanium layer 25 may be selectively formed in the opening 23. The single-crystalline germanium layer 25 may be formed by a selective epitaxial growth (SEG) process. The SEG process may be performed by a reduced pressure chemical vapor deposition method or a lower pressure chemical vapor deposition method. The SEG process may use a hydrogen gas as a flow gas. A germanium source of the SEG process may be germanium tetrahydride ($GeH_4$). Edge portions of the single-crystalline germanium layer 25 may be inclined by occurrence of crystal planes of (111) and/or (113). A chemical mechanical polishing (CMP) process may be performed for planarization of the single-crystalline germanium layer 25.

Figure 5:
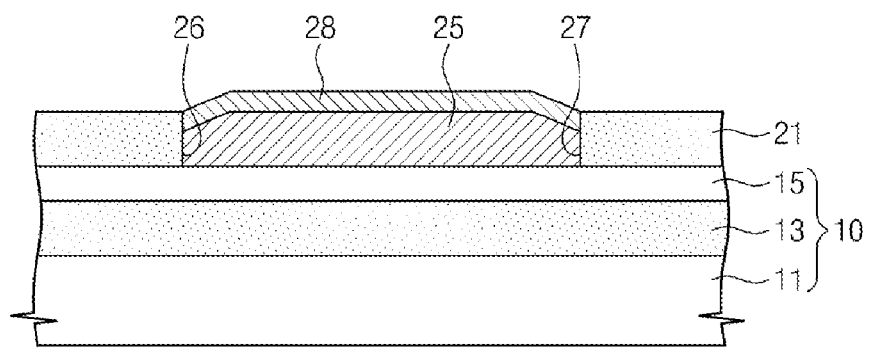

Referring to FIG. 5, a contact layer 28 doped with dopants of an n-type or a p-type may be formed on the single-crystalline germanium layer 25. As illustrated in FIG. 5, light may be reflected by first and second facets 26 and 27 of the single-crystalline germanium layer 25, thereby providing laser. The single-crystalline germanium layer 25 functions as a Fabry Perot cavity. Even though not shown in the drawings, an upper electrode may be formed on the contact layer 28.

As described above, the surface roughness of the sidewalls of the patterned mask layer 21 may be reduced or minimized, and the first and second facets 26 and 27 of the single-crystalline germanium layer 25 may be formed along the sidewalls of the patterned mask layer 21. The first and second facets 26 and 27 of the single-crystalline germanium layer 25 may function as mirror surfaces. As a result, according to embodiments of the inventive concept, it is possible to omit an additional polishing process for formation of the Fabry Perot cavity. Generally, after a single-crystalline germanium layer is formed, it may be cut and then a polishing process may be performed on both ends of the cut single-crystalline germanium layer. The general method may not monolithically integrate a laser device with other optical devices on a bulk silicon substrate or a SOI substrate. However, according to embodiments of the inventive concept, the additional polishing process may be omitted as described above, such that it is possible to monolithically integrate the semiconductor laser device with other optical devices on a bulk silicon substrate or a SOI substrate.

Figure 6:
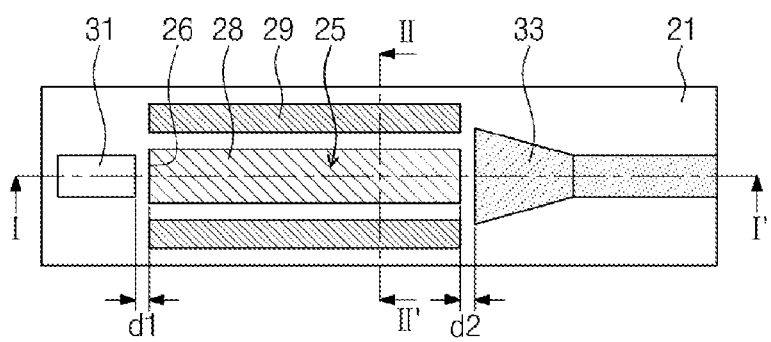
FIG. 6 is a plan view illustrating a combination structure of an optical coupler and a semiconductor laser device according to embodiments of the inventive concept.
Figure 7:
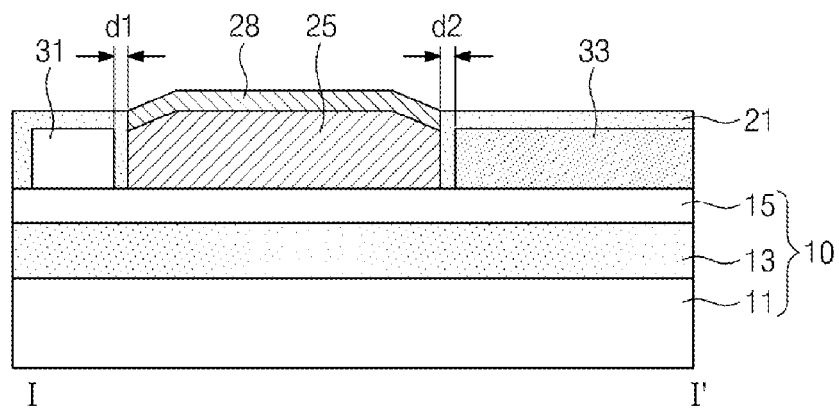
FIG. 7 is a cross-sectional view taken along a line I-I' of FIG. 6.
Figure 8:
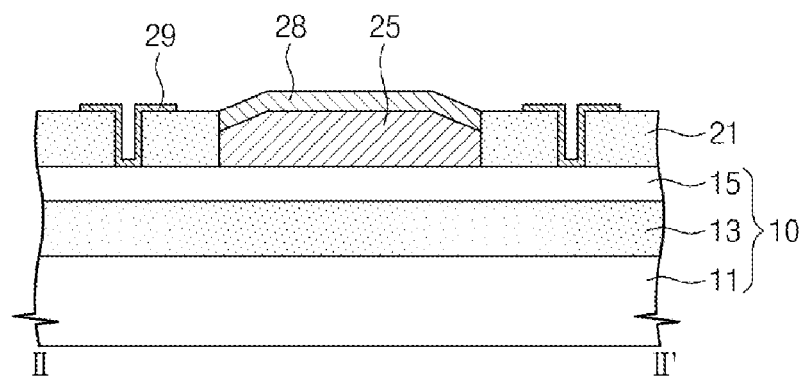
FIG. 8 is a cross-sectional view taken along a line II-II' of FIG. 6.

FIGS. 6 to 8 illustrate a monolithic integration of an optical coupler and the semiconductor laser device formed by the above method according to embodiments of the inventive concept.

Referring to FIGS. 6 to 8, after or before forming the single-crystalline germanium layer 25, a spacer 31 and the optical coupler 33 may be formed on the semiconductor substrate 10. For example, as illustrated in FIG. 7, the spacer 31 and the optical coupler 33 may be formed on the semiconductor substrate 10 and then the mask layer 21 may be formed to cover the spacer 31 and the optical coupler 33. Subsequently, the single-crystalline germanium layer 25 may be formed by the processes described with reference to FIGS. 1 to 5. Thus, a top surface of the single-crystalline germanium layer 25 used as the Fabry Perot cavity may be disposed at a height different from a top surface of the spacer 31 and/or a top surface of the optical coupler 33. Additionally, as illustrated in FIG. 8, electrode pads 29 may be formed on the mask layer 21. The electrode pads 29 may penetrate the mask layer 21 so as to be in electrically contact with the single-crystalline silicon layer 15 at both sides of the single-crystalline germanium layer 25.

The spacer 31 may be formed to be adjacent to a first end of the single-crystalline germanium layer 25. The spacer 31 may be spaced apart from the single-crystalline germanium layer 25 by a first distance d1. The spacer 31 and the single-crystalline germanium layer 25 may be spaced apart from each other by the mask layer 21. Alternatively, the spacer 31 may be in contact with the single-crystalline germanium layer 25. The spacer 31 may be formed of a material different from the mask layer 21. For example, the spacer 31 may be formed metal (e.g., platinum, silver, and/or aluminum) or any kind material (e.g., silicon oxide) having a refractive index different from that of the mask layer 21. The spacer 31 may be designed to having a maximum reflective index by a reflective index condition of a multi-layer. For example, the spacer 31 may include a grating mirror. The grating mirror may have a photonic band gap structure. Additionally, the spacer 31 may include an empty space formed in a trench exposing the first facet 26 (of FIG. 6) of the single-crystalline germanium layer 25. The optical coupler 33 may be formed to be adjacent to a second end of the single-crystalline germanium layer 25. The optical coupler 33 may be an optical waveguide formed of single-crystalline silicon or silicon nitride. The optical coupler 33 may be spaced apart from the single-crystalline germanium layer 25 by a second distance d2. Reflective indexes of both ends of the single-crystalline germanium layer 25 may be suitably controlled by controlling the first distance d1 and the second distance d2. The first end of the single-crystalline germanium layer 25 may have a reflective index greater than that of the second end (adjacent to the optical coupler 33) of the single-crystalline germanium layer 25. The mask layer 21 may fill between the first end of the single-crystalline germanium layer 25 and the spacer 31 and between the second end of the single-crystalline germanium layer 25 and the optical coupler 33. For example, the mask layer 21 may be formed of a silicon oxide layer.

A laser light emitted from the single-crystalline germanium layer 25 used as the Fabry Perot cavity may be incident into the optical coupler 33 and then proceed along an optical waveguide.

As described above, the semiconductor laser device according to embodiments of the inventive concept may be monolithically integrated with optical devices such as a silicon optical modulator, a passive waveguide device, and/or a photo detector, which are fabricated by the silicon photonics technique, on the SOI substrate or the bulk silicon substrate.

According to embodiments of the inventive concept, a laser gain material (e.g., the single-crystalline germanium layer) may be formed by the SEG method. Thus, a cutting process and/or a polishing process for both facets of the Fabry Perot cavity may be omitted in the method of fabricating the semiconductor laser device.

Additionally, the semiconductor laser device may be monolithically integrated with the silicon optical modulator, the passive waveguide device, and/or the photo detector fabricated by the silicon photonics technique on the SOI substrate or the bulk silicon substrate.

While the inventive concept has been described with reference to example embodiments, it will be apparent to those skilled in the art that various changes and modifications may be made without departing from the spirit and scope of the inventive concept. Therefore, it should be understood that the above embodiments are not limiting, but illustrative. Thus, the scope of the inventive concept is to be determined by the broadest permissible interpretation of the following claims and their equivalents, and shall not be restricted or limited by the foregoing description.

What is claimed is:

1. A method of fabricating a semiconductor laser device, comprising:
    forming a mask layer on a substrate;
    patterning the mask layer to form a mask pattern having an opening exposing t e substrate;
    forming a single-crystalline germanium layer used as a Fabry Perot cavity in the opening by a selective epitaxial growth (SEG) method;
    forming an electrode on the single-crystailine germanium layer;
    forming a spacer adjacent to a first end of the Fabry Perot cavity; and
    forming an optical coupler adjacent to a second end of the Fabry Perot cavity, wherein the mask layer fills between the first end of the Fabry Perot cavity and the spacer and between the second end of the Fabry Perot cavity and the optical coupler; and
    wherein patterning the mask layer includes:
    after etching the mask layer by one of a dry etching process and a wet etching process, etching the mask layer by the other of the dry etching process and the wet etching layer for improving a surface roughness of sidewalls of the mask pattern.

2. The method of claim 1, wherein the mask layer is formed of silicon oxide.

3. The method of claim 2, wherein the wet etching process uses hydrofluoric acid.

4. The method of claim 1, wherein the substrate is a silicon substrate or a silicon-on-insulator (SOI) substrate.

5. The method of claim 1, wherein the spacer includes metal or silicon oxide.

6. The method of claim 1, wherein the spacer includes a grating mirror.

7. The method of claim 6, wherein the grating mirror has a photonic band gap structure.

8. The method of claim 1, wherein the spacer and the Fabry Perot cavity are spaced apart from each other by the mask layer.

9. The method of claim 1, wherein the optical coupler includes an optical waveguide.

10. The method of claim 9, wherein the optical waveguide includes single-crystalline silicon or silicon nitride.

11. The method of claim 1, wherein a top surface of the Fabry Perot cavity is disposed at a height different from top surfaces of the spacer and the optical coupler.

12. A method of fabricating a semiconductor laser device, comprising:
    forming a mask layer on a substrate;
    patterning the mask layer to form a mask pattern having an opening exposing the substrate;
    forming a single-crystalline germanium layer used as a Fabry Perot cavity in the opening by a selective epitaxial growth (SEG) method; and
    forming an electrode on the single-crystalline germanium layer;
    forming a spacer adjacent to a first end of the Fabry Perot cavity; and
    forming an optical coupler adjacent to a second end of the Fabry Perot cavity;
    wherein a top surface of the Fabry Perot cavity is disposed at a height different from top surfaces of the spacer and the optical coupler.

13. The method of claim 12, wherein patterning the mask layer includes, after etching the mask layer by one of a dry etching process and a wet etching process, etching the mask layer by the other of the dry etching process and the wet etching layer.

* * * * *